United States Patent
Chen et al.

(10) Patent No.: US 10,510,748 B2
(45) Date of Patent: Dec. 17, 2019

(54) TRANSISTOR FOR INCREASING A RANGE OF A SWING OF A SIGNAL

(71) Applicant: RichWave Technology Corp., Taipei (TW)

(72) Inventors: Chih-Sheng Chen, Taipei (TW); Tsung-Han Lee, Taipei (TW); Chang-Yi Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 15/638,351

(22) Filed: Jun. 29, 2017

(65) Prior Publication Data

US 2018/0076194 A1    Mar. 15, 2018

(30) Foreign Application Priority Data

Sep. 13, 2016  (TW) .............................. 105129675 A

(51) Int. Cl.
*H01L 27/06* (2006.01)

(52) U.S. Cl.
CPC ................................ *H01L 27/0629* (2013.01)

(58) Field of Classification Search
CPC ..... H01L 27/0629; H01L 29/78; H01L 29/93; H01L 29/94; H01L 27/0805; H01L 27/0623

See application file for complete search history.

(56) References Cited

U.S. PATENT DOCUMENTS

| 5,446,300 A * | 8/1995 | Amato ................ H01L 27/0629 257/343 |
| 7,952,444 B2 * | 5/2011 | Xiong .................. H03B 5/1228 331/108 C |
| 9,294,073 B2 * | 3/2016 | Homol ...................... H03F 3/72 |
| 2005/0269619 A1 * | 12/2005 | Shor .................... H01L 27/0811 257/313 |
| 2006/0006431 A1 * | 1/2006 | Jean ........................ H01L 29/93 257/288 |
| 2008/0224228 A1 * | 9/2008 | Teo .................... H01L 27/10805 257/379 |

(Continued)

FOREIGN PATENT DOCUMENTS

| TW | 481835 | 4/2002 |
| TW | 200603413 A | 1/2006 |
| TW | 201501293 A | 1/2015 |

*Primary Examiner* — Khiem D Nguyen
(74) *Attorney, Agent, or Firm* — Winston Hsu

(57) ABSTRACT

A transistor includes a first doping well, a second doping well, a first doping area, a second doping area, a gate layer, and at least one compensation capacitor. The first doping well and the second doping well are formed in a structure layer. The first doping area and the second doping area are formed in the first doping well and have a first conductivity type, the second doping well has a second conductivity type, and the first doping area is used for transmitting the signal. The at least one compensation capacitor is used for adjusting a voltage drop of a parasitic junction capacitor between the first doping area and the first doping well, a voltage drop of a parasitic junction capacitor between the first doping well and the second doping well, or a voltage drop of a parasitic junction capacitor between the second doping well and the structure layer.

22 Claims, 10 Drawing Sheets

(56) References Cited

U.S. PATENT DOCUMENTS

| | | | | |
|---|---|---|---|---|
| 2009/0064922 A1* | 3/2009 | Boone | ................... | C30B 23/02 |
| | | | | 117/3 |
| 2010/0001351 A1* | 1/2010 | Zhang | ................ | H01L 27/0207 |
| | | | | 257/392 |
| 2010/0226166 A1* | 9/2010 | Jung | ..................... | G11C 5/145 |
| | | | | 365/149 |
| 2013/0001664 A1* | 1/2013 | Khor | .................. | H01L 27/0629 |
| | | | | 257/300 |
| 2013/0260486 A1* | 10/2013 | Huang | .................. | H01L 29/93 |
| | | | | 438/18 |
| 2013/0321061 A1* | 12/2013 | Chen | ..................... | H03K 17/16 |
| | | | | 327/382 |
| 2014/0239364 A1 | 8/2014 | Huang | | |
| 2015/0194538 A1 | 7/2015 | Marino | | |

\* cited by examiner

TRANSISTOR FOR INCREASING A RANGE OF A SWING OF A SIGNAL

CROSS REFERENCE TO RELATED APPLICATION

This application claims the benefit of TW Application No. 105129675 filed on Sep. 13, 2016, the contents of which are incorporated herein.

TECHNICAL FIELD

The present invention relates to a transistor, and particularly to a transistor for increasing a range of a swing of a signal.

BACKGROUND

When a transistor transmits or receives a signal, a swing of the signal will cross all parasitic junction capacitors existing between a doping area of a drain (a source) of the transistor and a substrate for forming the transistor. Because the parasitic junction capacitor having the minimum capacitance value may also have a maximum voltage drop, a corresponding parasitic diode is easily turned on, resulting in the swing of the signal being significantly limited. Because the swing of the signal is significantly limited, power delivered by the signal is also significantly limited. Therefore, how to design a transistor which can increase a range of the swing of the signal becomes an important issue.

SUMMARY

An embodiment of the present invention provides a transistor for increasing a range of a swing of a signal. The transistor includes a first doping well, a second doping well, a first doping area, a second doping area, a gate area, and at least one compensation capacitor. The first doping well is formed in a structure layer. The second doping well is formed in the structure layer, and the second doping well is formed between the first doping well and the structure layer. The first doping area is formed in the first doping well for transmitting the signal. The second doping area is formed in the first doping well, wherein the first doping area, the second doping area, and the second doping well have a first conductivity type, and the first doping well has a second conductivity type. The gate area is used for making a channel be formed between the first doping area and the second doping area. The at least one compensation capacitor is electrically connected between the first doping area and the first doping well, or the first doping well and the second doping well, or the second doping well and a first reference potential. A first parasitic junction capacitor exists between the first doping area and the first doping well, a second parasitic junction capacitor exists between the first doping well and the second doping well, and a third parasitic junction capacitor exists between the second doping well and the structure layer; and the at least one compensation capacitor is used for adjusting a voltage drop of the first parasitic junction capacitor, a voltage drop of the second parasitic junction capacitor, or a voltage drop of the third parasitic junction capacitor.

Another embodiment of the present invention provides a transistor. The transistor includes a first doping well, a second doping well, a first doping area, a second doping area, a gate area, and at least one compensation capacitor. The first doping well is formed in a structure layer. The second doping well is formed in the structure layer, and the second doping well is formed between the first doping well and the structure layer. The first doping area is formed in the first doping well. The second doping area is formed in the first doping well, wherein the first doping area, the second doping area, and the second doping well have a first conductivity type, and the first doping well has a second conductivity type. The gate area is used for making a channel be formed between the first doping area and the second doping area. The at least one compensation capacitor is electrically connected between the first doping area and the first doping well, or the first doping well and the second doping well, or the second doping well and a first reference potential. A first parasitic junction capacitor exists between the first doping area and the first doping well, a second parasitic junction capacitor exists between the first doping well and the second doping well, and a third parasitic junction capacitor exists between the second doping well and the structure layer. An $N^{th}$ parasitic junction capacitor of the first parasitic junction capacitor, the second parasitic junction capacitor, and the third parasitic junction capacitor has a minimum capacitance value, and an $M^{th}$ parasitic junction capacitor of the first parasitic junction capacitor, the second parasitic junction capacitor, and the third parasitic junction capacitor has a capacitance value different from the minimum capacitance value of the $N^{th}$ parasitic junction capacitor. When N is 1, the at least one compensation capacitor includes a first compensation capacitor electrically connected between the first doping area and the first doping well; when N is 2, the at least one compensation capacitor includes a second compensation capacitor electrically connected between the first doping well and the second doping well; or when N is 3, the at least one compensation capacitor includes a third compensation capacitor electrically connected between the second doping well and the first reference potential.

Another embodiment of the present invention provides a transistor. The transistor includes a first doping well, a second doping well, a first doping area, a second doping area, a gate area, and at least one compensation capacitor. The first doping well is formed in a structure layer. The second doping well is formed in the structure layer, and the second doping well is formed between the first doping well and the structure layer. The first doping area is formed in the first doping well. The second doping area is formed in the first doping well, wherein the first doping area, the second doping area, and the second doping well have a first conductivity type, and the first doping well has a second conductivity type. The gate area is used for making a channel be formed between the first doping area and the second doping area. The at least one compensation capacitor is electrically connected between the first doping well and the second doping well, or the second doping well and a first reference potential.

DETAILED DESCRIPTION

Figure 1:
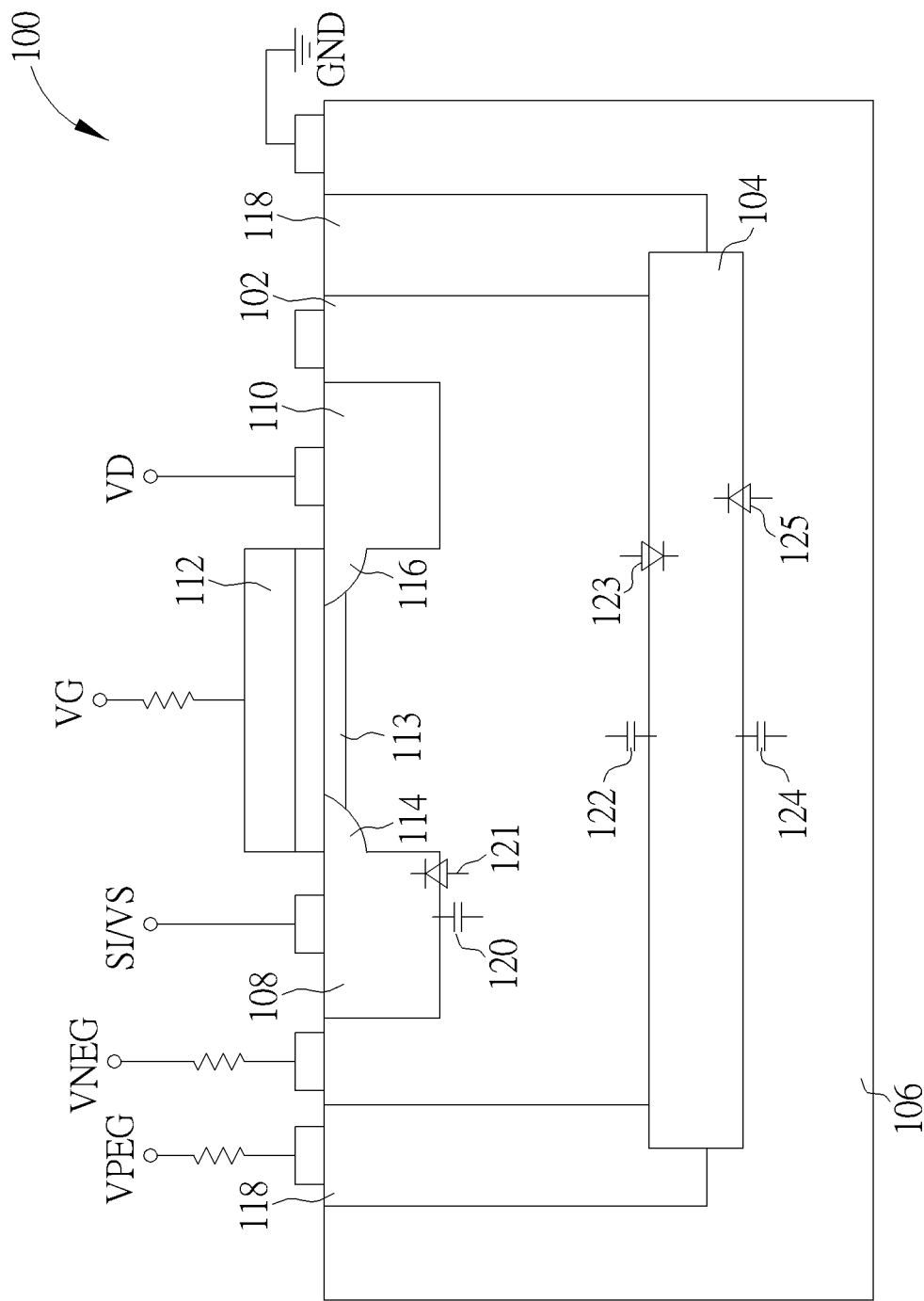
FIG. 1 is a diagram illustrating a transistor for increasing a range of a swing of a signal according to a first embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Please refer to FIG. 1. FIG. 1 is a diagram illustrating a transistor 100 for increasing a range of a swing of a signal according to a first embodiment of the present invention. As shown in FIG. 1, the transistor 100 includes a first doping well 102, a second doping well 104, a structure layer 106, a first doping area 108, a second doping area 110, a gate area 112, a first light doping area 114, a second light doping area 116, and a third doping area 118, wherein the structure layer 106 includes a substrate, and the structure layer 106 is used for receiving a first reference potential (e.g. ground GND). In addition, the first doping area 108 can be a source of the transistor 100 and the second doping area 110 can be a drain of the transistor 100, or the first doping area 108 can be the drain of the transistor 100 and the second doping area 110 can be the source of the transistor 100. The first doping well 102 and the second doping well 104 are formed in the structure layer 106, and the second doping well 104 is formed between the first doping well 102 and the structure layer 106. For example, as shown in FIG. 1, the first doping well 102 is formed in the second doping well 104; and the first doping area 108, the second doping area 110, the first light doping area 114, and the second light doping area 116 are formed in the first doping well 102, wherein the first doping area 108 is used for transmitting a signal SI. The first light doping area 114 is formed in a side of the first doping area 108 (wherein the side of the first doping area 108 is near the gate area 112), and the second light doping area 116 is formed in a side of the second doping area 110 (wherein the side of the second doping area 110 is near the gate area 112). The third doping area 118 is formed in the structure layer 106 for surrounding the first doping area 108 and the second doping area 110, and electrically connected to the second doping well 104, wherein the first doping area 108, the second doping area 110, the first light doping area 114, the second light doping area 116, the second doping well 104, and the third doping area 118 have a first conductivity type, and the first doping well 102 and the structure layer 106 have a second conductivity type. For example, the first conductivity type could be an N-type conductivity type, and the second conductivity type could be a P-type conductivity type. In another embodiment, the first conductivity type could be a P-type conductivity type, and the second conductivity type could be an N-type conductivity type. In addition, doping concentrations of the first light doping area 114 and the second light doping area 116 are less than doping concentrations of the first doping area 108 and the second doping area 110, wherein the first light doping area 114 and the second light doping area 116 is used for preventing from a short channel effect existing between the first doping area 108 and the second doping area 110.

As shown in FIG. 1, a first parasitic junction capacitor 120 and a first parasitic diode 121 exist between the first doping area 108 and the first doping well 102, a second parasitic junction capacitor 122 and a second parasitic diode 123 exist between the first doping well 102 and the second doping well 104, a third parasitic junction capacitor 124 and a third parasitic diode 125 exist between the second doping well 104 and the structure layer 106, wherein the transistor 100 can be a complementary metal-oxide-semiconductor (CMOS) transistor (but the present invention is not limited to the transistor 100 being a CMOS transistor), a capacitance value of the first parasitic junction capacitor 120 is greater than a capacitance value of the second parasitic junction capacitor 122, and the capacitance value of the second parasitic junction capacitor 122 is greater than a capacitance value of the third parasitic junction capacitor 124. In addition, the capacitance value of the first parasitic junction capacitor 120 and a first threshold VTH1 of the first parasitic diode 121 are determined by a cross-sectional area and the doping concentration of the first doping area 108, and a cross-sectional area and a doping concentrations of the first doping well 102; the capacitance value of the second parasitic junction capacitor 122 and a second threshold VTH2 of the second parasitic diode 123 are determined by the cross-sectional area and the doping concentrations of the first doping well 102, and a cross-sectional area and a doping concentration of the second doping well 104; and the capacitance value of the third parasitic junction capacitor 124 and a third threshold VTH3 of the third parasitic diode 125 are determined by the cross-sectional area and the doping concentration of the second doping well 104, and a cross-sectional area and a doping concentration of the structure layer 106.

Figure 2:
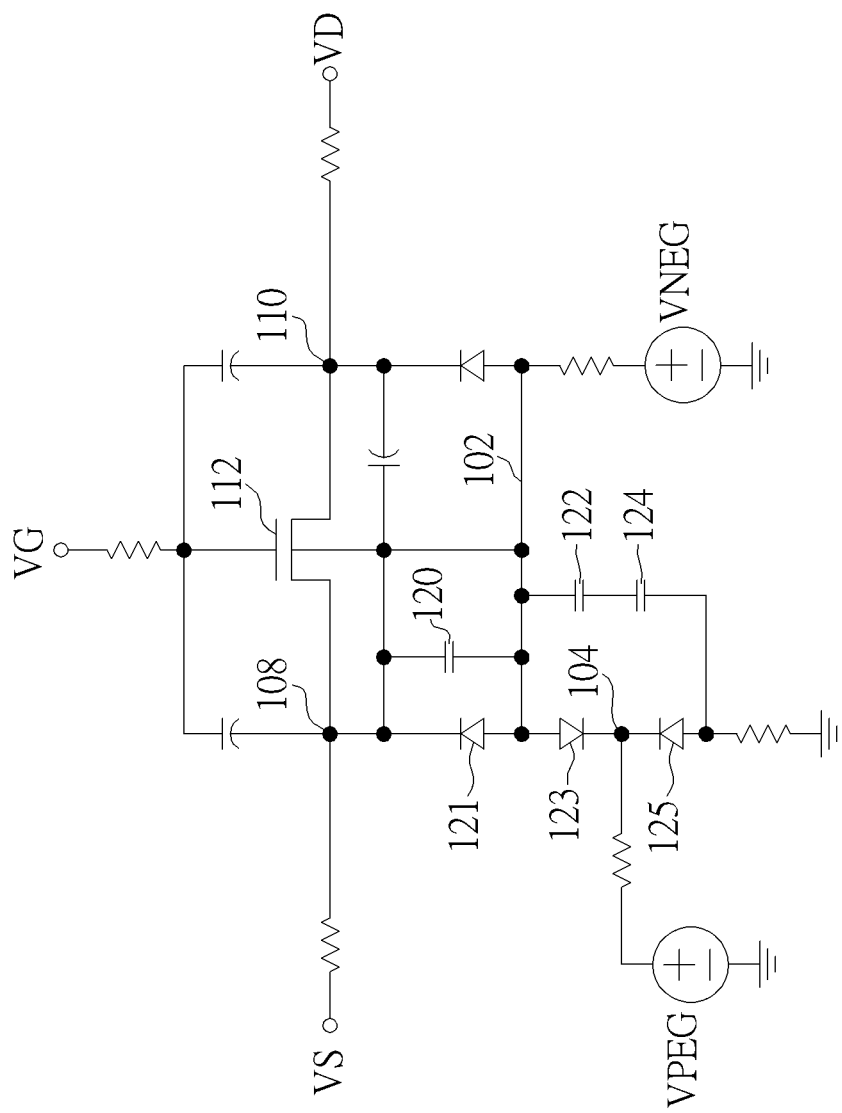
FIG. 2 is a diagram illustrating a circuit structure corresponding to FIG. 1.
Figure 3:
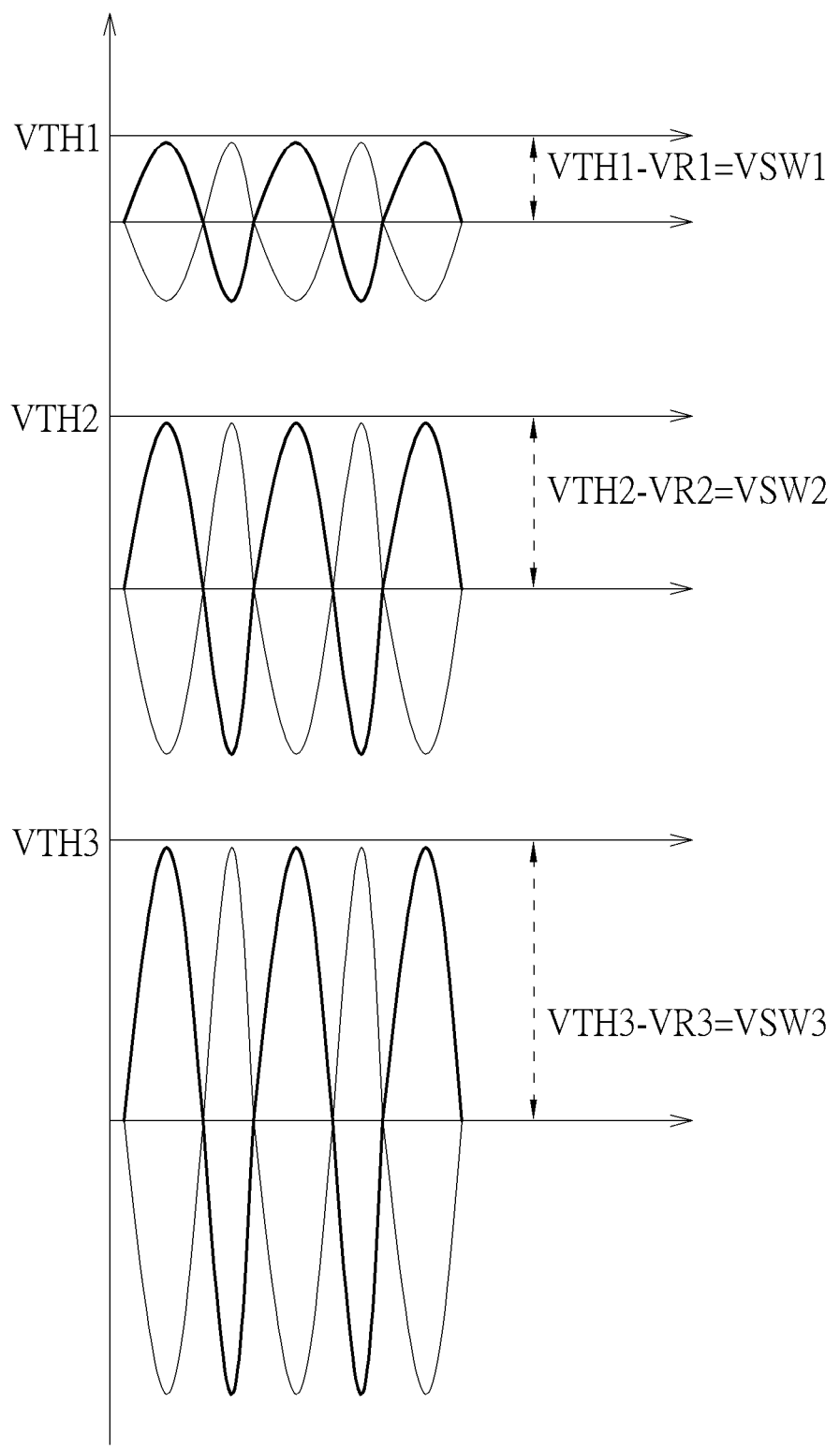
FIG. 3 is a diagram illustrating the first voltage swing being equal to the difference between the first threshold and the first reverse bias, the second voltage swing being equal to the difference between the second threshold and the second reverse bias, and the third voltage swing being equal to the difference between the third threshold and the third reverse bias.

When the first doping area 108 transmits the signal SI, a sum of a voltage drop of the first parasitic junction capacitor 120, a voltage drop of the second parasitic junction capacitor 122, and a voltage drop of the third parasitic junction capacitor 124 is substantially equal to a swing of the signal SI. In the embodiment, the capacitance value of the first parasitic junction capacitor 120 is greater than the capacitance value of the second parasitic junction capacitor 122, the capacitance value of the second parasitic junction capacitor 122 is greater than the capacitance value of the third parasitic junction capacitor 124, and an inverse relationship exists between a voltage drop of one parasitic junction capacitor and a capacitance value of the one parasitic junction capacitor. The voltage drop of the third parasitic junction capacitor 124 is greater than the voltage drop of the first parasitic junction capacitor 120 and the voltage drop of the second parasitic junction capacitor 122. Therefore, in the embodiment of FIG. 1, when the first doping area 108 transmits the signal SI, the gate area 112 can receive a proper voltage VG to make a channel 113 be formed between the first doping area 108 and the second doping area 110 to turn on the transistor 100, the first doping well 102 receives a first voltage VNEG, and the second doping well 104 receives a second voltage VPEG through the third doping area 118, wherein a voltage polarity of the first voltage VNEG is opposite to a voltage polarity of the second voltage VPEG, and a voltage VS applied to the first doping area 108 and a voltage VD applied to the second doping area 110 are approximately equal to ½ VG. In one embodiment, the voltage VG is a positive voltage, the first voltage VNEG is a negative voltage, the second voltage VPEG is a positive voltage. In addition, a circuit structure corresponding to FIG. 1 can be referred to FIG. 2. As shown in FIG. 2, the voltage VS applied to the first doping area 108 and the first voltage VNEG received by the first doping well 102 can make a first reverse bias VR1 (VR1=VNEG−VS) across the first parasitic diode 121, the first voltage VNEG received by the first doping well 102 and the second voltage VPEG received by the second doping well 104 can make a second reverse bias VR2 (VR2=VNEG−VPEG) across the second parasitic diode 123, and the second voltage VPEG received by the second doping well 104 and the first reference potential (e.g. the ground GND) received by the structure layer 106 can make a third reverse bias VR3 (VR3=VGND−VPEG) across the third parasitic diode 125, wherein VGND represents a potential of the ground GND. Therefore, as shown in FIG. 3, because the first reverse bias VR1 is across the first parasitic diode 121, a first voltage swing VSW1 tolerable to the first parasitic diode 121 is equal to a difference between the first threshold VTH1 and the first reverse bias VR1; because the second reverse bias VR2 is across the second parasitic diode 123, a second voltage swing VSW2 tolerable to the second parasitic diode 123 is equal to a difference between the second threshold VTH2 and the second reverse bias VR2; and because the third reverse bias VR3 is across the third parasitic diode 125, a third voltage swing VSW3 tolerable to the third parasitic diode 125 is equal to a difference between the third threshold VTH3 and the third reverse bias VR3. Therefore, as shown in FIG. 3, because the first reverse bias VR1, the second reverse bias VR2, and the third reverse bias VR3 can increase the first voltage swing VSW1, the second voltage swing VSW2, and the third voltage swing VSW3 respectively, the first voltage VNEG received by the first doping well 102 and the second voltage VPEG received by the second doping well 104 can effectively prevent the first parasitic diode 121, the second parasitic diode 123, and the third parasitic diode 125 from being turned on when the first doping area 108 transmits the signal SI. That is, the transistor 100 can increase a range of the swing of the signal SI.

Figure 4:
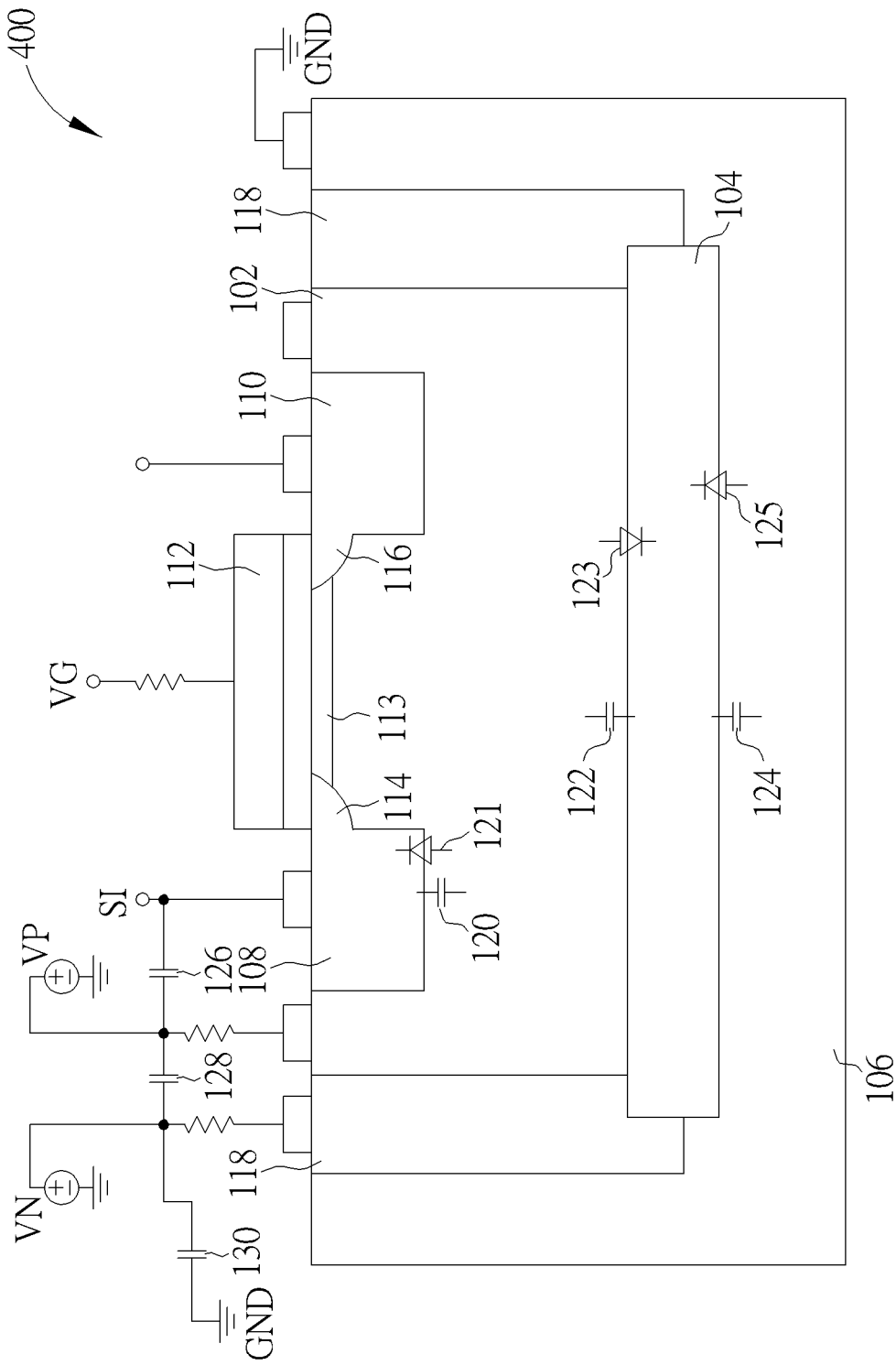
FIG. 4 is a diagram illustrating a transistor for increasing a range of a swing of a signal according to a second embodiment of the present invention.

Please refer to FIG. 4. FIG. 4 is a diagram illustrating a transistor 400 for increasing a range of a swing of a signal according to a second embodiment of the present invention. As shown in FIG. 4, differences between the transistor 400 and the transistor 100 are that the transistor 400 further has a first compensation capacitor 126, a second compensation capacitor 128, a third compensation capacitor 130, the first doping well 102 is electrically connected to a low reference potential VP, and the second doping well 104 is electrically connected to a high reference potential VN, wherein the first compensation capacitor 126 is electrically connected between the first doping area 108 and the first doping well 102 for compensating the first parasitic junction capacitor 120; the second compensation capacitor 128 is electrically connected between the first doping well 102 and the second doping well 104 for compensating the second parasitic junction capacitor 122; the third compensation capacitor 130 is electrically connected between the second doping well 104 and the first reference potential (e.g. the ground GND) for compensating the third parasitic junction capacitor 124; and the first compensation capacitor 126, the second compensation capacitor 128, and the third compensation capacitor 130 are capacitor devices, such as metal-insulator-metal (MIM) capacitors. In one embodiment, the compensation capacitor could be a compensation capacitor device having equivalent capacitance value. In addition, a capacitance value of the first compensation capacitor 126, a capacitance value of the second compensation capacitor 128, and a capacitance value of the third compensation capacitor 130 are determined at least by the capacitance value of the first parasitic junction capacitor 120, the capacitance value of the second parasitic junction capacitor 122, and the capacitance value of the third parasitic junction capacitor 124. That is, the capacitance value of the first compensation capacitor 126 can be determined according to equation (1):

$$C_j = \frac{\varepsilon_s}{w} = \left\{ \frac{q\varepsilon_s N_A N_D}{2(V_{bi} + V_R)(N_A + N_D)} \right\}^{1/2} \quad (1)$$

$C_j$ is the capacitance value of the first compensation capacitor 126, $\varepsilon_s$ is a dielectric constant, $N_A$ is a receptor concentration of the first doping area 108 and the first doping well 102, $N_D$ is a donor concentration of the first doping area 108 and the first doping well 102, $V_{bi}$ is a built-in potential, and $V_R$ is an external voltage. In addition, the capacitance value of the second compensation capacitor 128 and the capacitance value of the third compensation capacitor 130 can be also determined according to equation (1), so further description thereof is omitted for simplicity.

Figure 5:
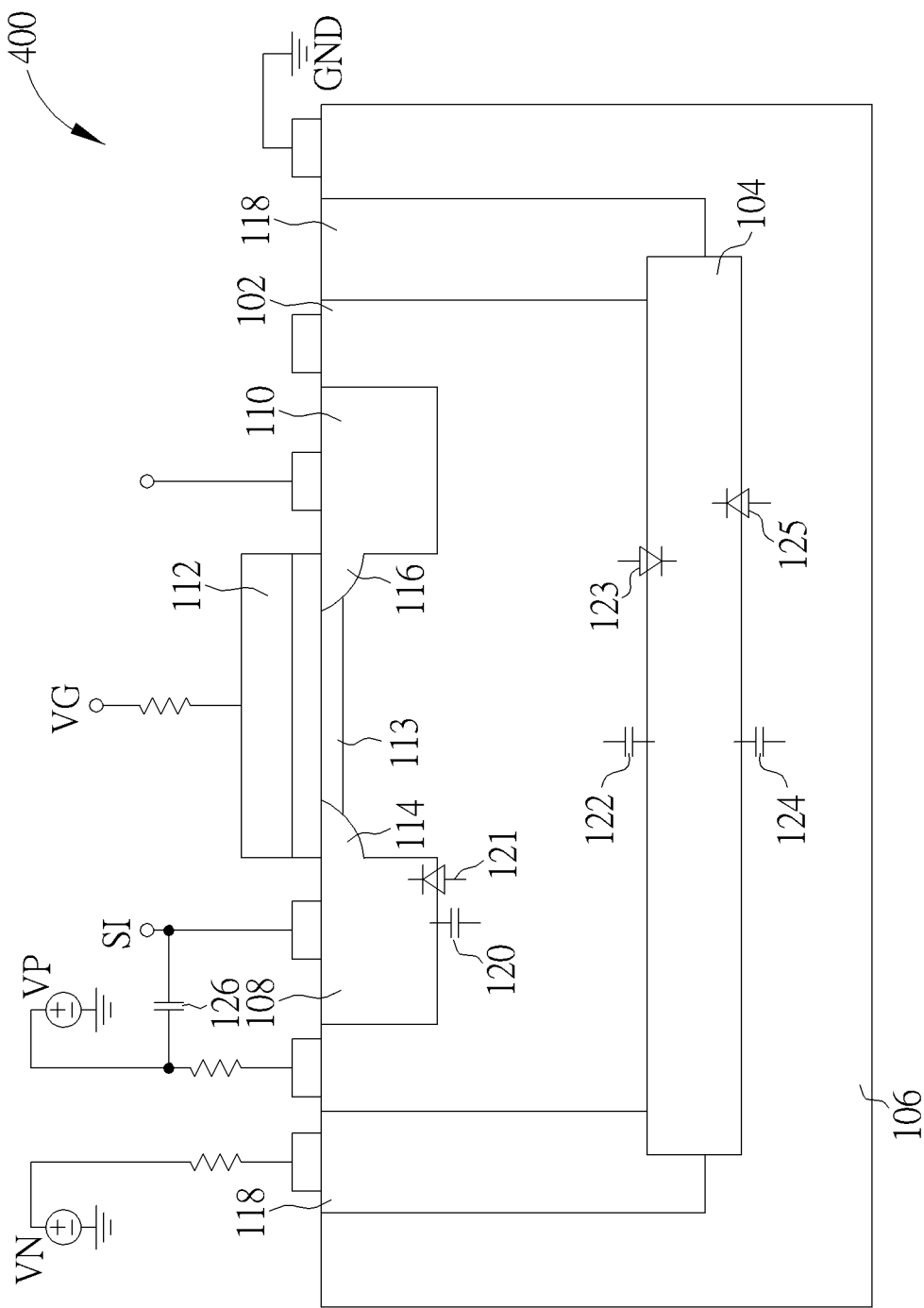
FIG. 5 is a diagram illustrating the transistor including the first compensation capacitor.
Figure 6:
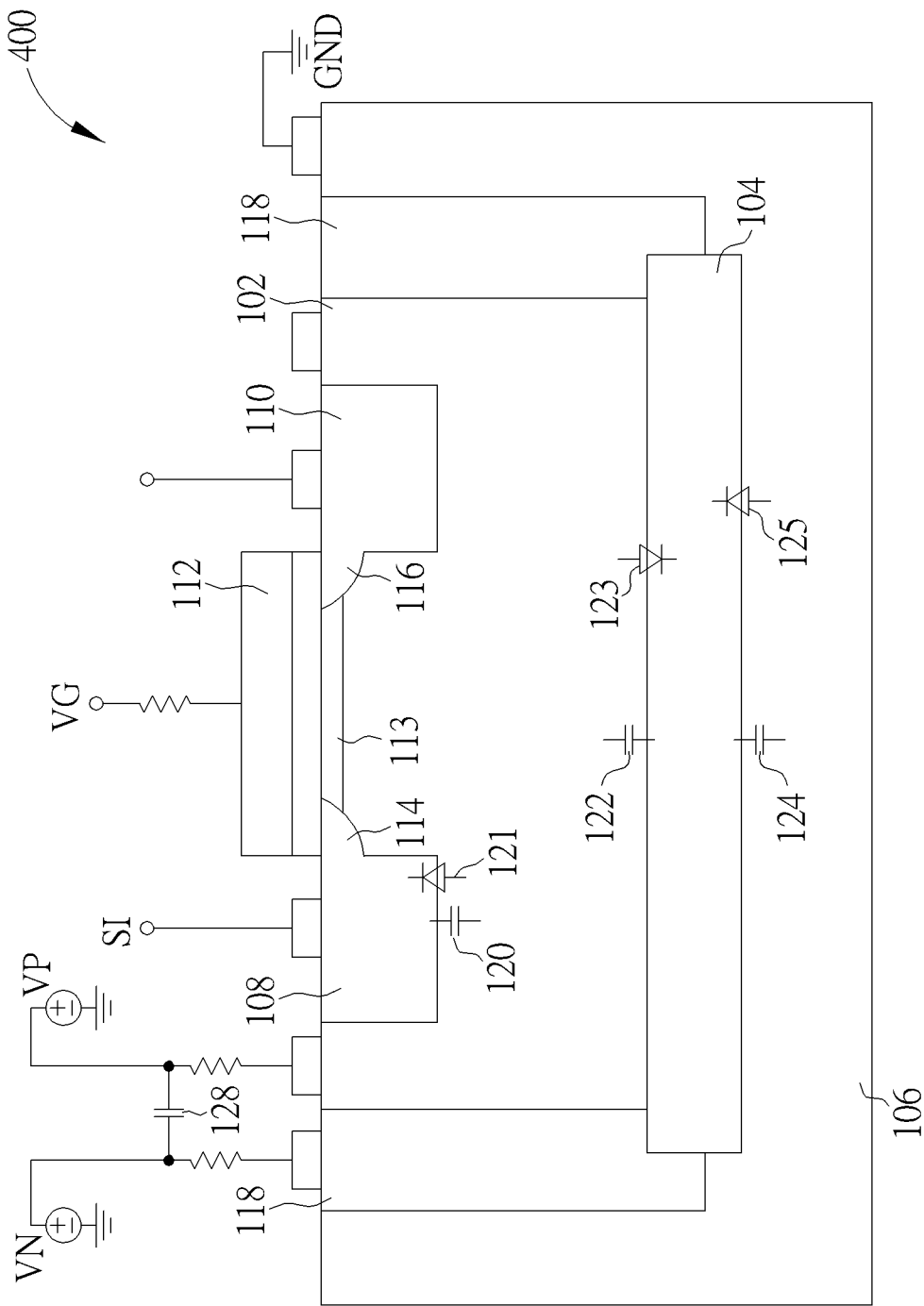
FIG. 6 is a diagram illustrating the transistor including the second compensation capacitor.
Figure 7:
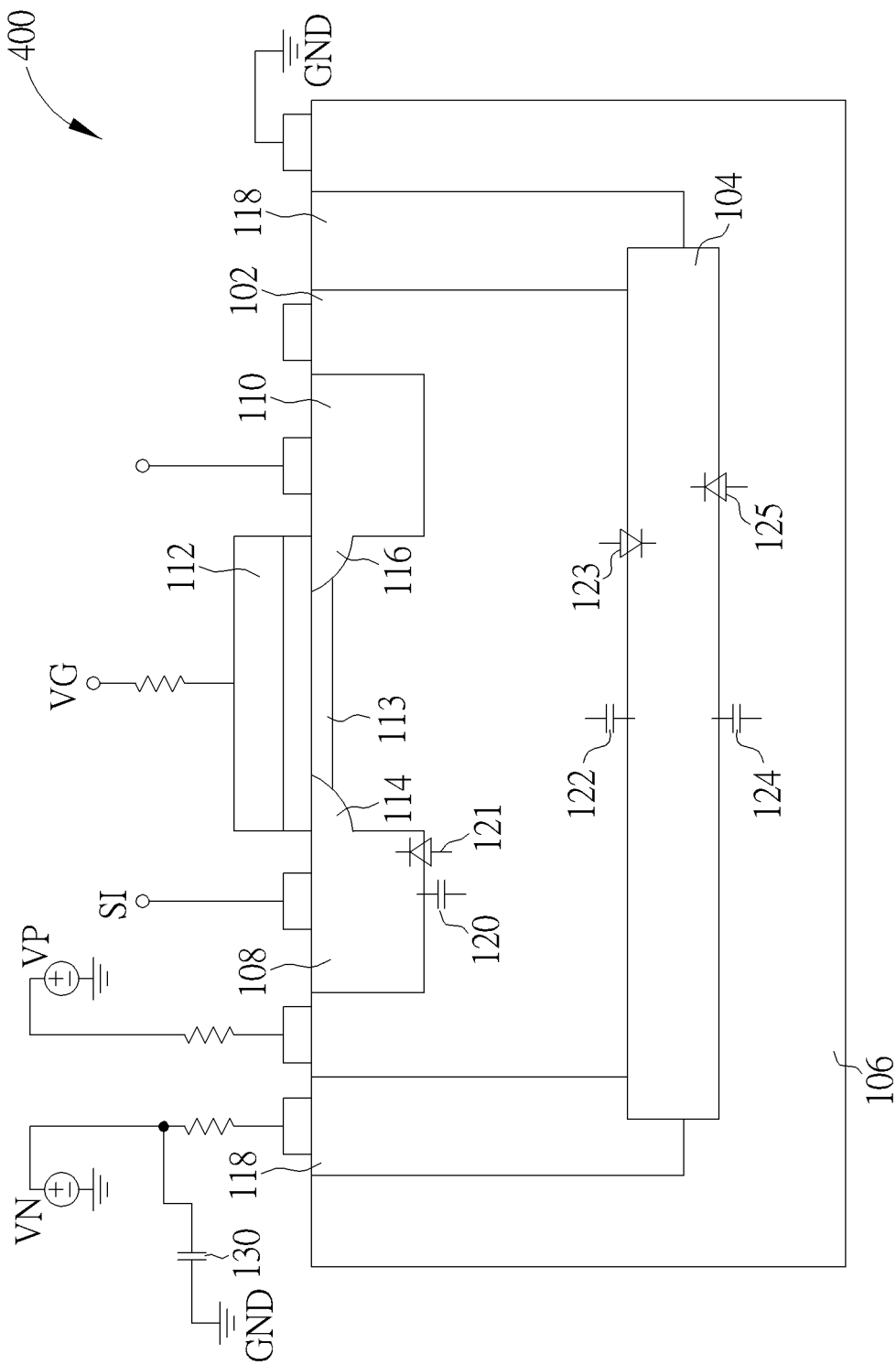
FIG. 7 is a diagram illustrating the transistor including the third compensation capacitor.
Figure 8:
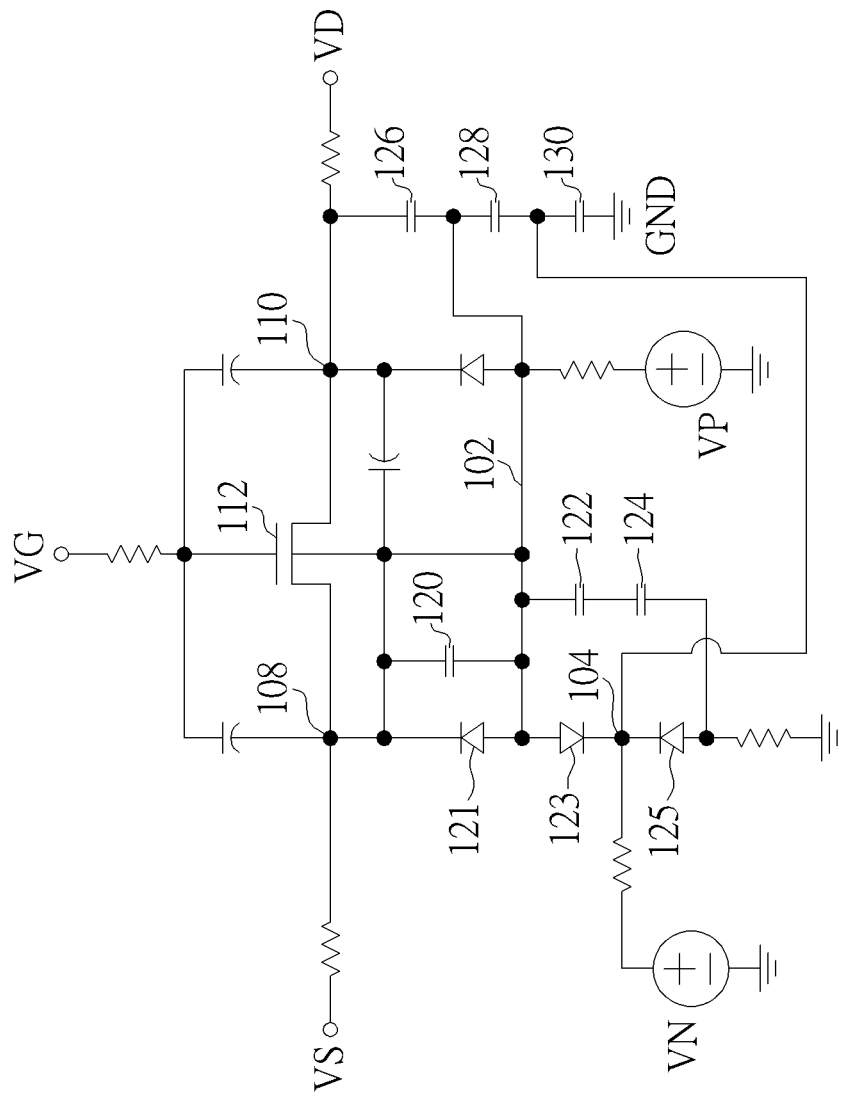
FIG. 8 is a diagram illustrating a circuit structure corresponding to FIG. 4.

In addition, in another embodiment of the present invention, the capacitance value of the first compensation capacitor 126, the capacitance value of the second compensation capacitor 128, and the capacitance value of the third compensation capacitor 130 can be further determined by the swing of the signal SI. Because an inverse relationship exists between a voltage drop of a parasitic junction capacitor and a capacitance value of the parasitic junction capacitor, the first compensation capacitor 126 of the transistor 400 can be utilized to compensate the first parasitic junction capacitor 120, utilize the second compensation capacitor 128 to compensate the second parasitic junction capacitor 122, and utilize the third compensation capacitor 130 to compensate the third parasitic junction capacitor 124 to reduce differences between the voltage drop of the first parasitic junction capacitor 120, the voltage drop of the second parasitic junction capacitor 122, and the voltage drop of the third parasitic junction capacitor 124. That is, when the first doping area 108 transmits the signal SI, the first compensation capacitor 126, the second compensation capacitor 128, and the third compensation capacitor 130 of the transistor 400 can be utilized to compensate the first parasitic junction capacitor 120, the second parasitic junction capacitor 122, and the third parasitic junction capacitor 124 respectively, simultaneously adjust the voltage drop of the first parasitic junction capacitor 120, the voltage drop of the second parasitic junction capacitor 122, and the voltage drop of the third parasitic junction capacitor 124 distributed according to the signal SI, and reduce the differences between the voltage drop of the first parasitic junction capacitor 120, the voltage drop of the second parasitic junction capacitor 122, and the voltage drop of the third parasitic junction capacitor 124 to prevent the first parasitic diode 121, the second parasitic diode 123, and the third parasitic diode 125 from being turned on. Therefore, the first compensation capacitor 126, the second compensation capacitor 128, and the third compensation capacitor 130 of the transistor 400 can be utilized to increase the range of the swing of the signal SI. In addition, the present invention is not limited to the transistor 400 simultaneously needing to have the first compensation capacitor 126, the second compensation capacitor 128, and the third compensation capacitor 130. That is, a number of compensation capacitors of the transistor 400 can be adjusted according to the voltage drop of the first parasitic junction capacitor 120, the voltage drop of the second parasitic junction capacitor 122, and the voltage drop of the third parasitic junction capacitor 124. So in another embodiment of the present invention, the transistor 400 can only include at least one compensation capacitor or any two compensation capacitors of the first compensation capacitor 126, the second compensation capacitor 128, and the third compensation capacitor 130 to compensate at least one corresponding parasitic junction capacitor or any two corresponding parasitic junction capacitors, simultaneously adjust the voltage drop of the first parasitic junction capacitor 120, the voltage drop of the second parasitic junction capacitor 122, and the voltage drop of the third parasitic junction capacitor 124, and reduce the differences between the voltage drop of the first parasitic junction capacitor 120, the voltage drop of the second parasitic junction capacitor 122, and the voltage drop of the third parasitic junction capacitor 124. Other embodiments of the present invention are shown in FIGS. 5-7, wherein FIG. 5 is a diagram illustrating the transistor 400 including the first compensation capacitor 126, FIG. 6 is a diagram illustrating the transistor 400 including the second compensation capacitor 128, and FIG. 7 is a diagram illustrating the transistor 400 including the third compensation capacitor 130. In addition, a circuit structure corresponding to FIG. 4 can be referred to FIG. 8.

In addition, in another embodiment of the present invention, at least one of the first compensation capacitor 126, the second compensation capacitor 128, and the third compensation capacitor 130 is used for making at least two of a sum of the capacitance value of the first parasitic junction capacitor 120 and the capacitance value of the first compensation capacitor 126, a sum of the capacitance value of the second parasitic junction capacitor 122 and the capacitance value of the second compensation capacitor 128, and a sum of the capacitance value of the third parasitic junction capacitor 124 and the capacitance value of the third compensation capacitor 130 be substantially equal to each other. For example, if the capacitance value of the first parasitic junction capacitor 120 is greater than the capacitance value of the second parasitic junction capacitor 122, and the capacitance value of the second parasitic junction capacitor 122 is greater than the capacitance value of the third parasitic junction capacitor 124, the first parasitic junction capacitor 120 is not compensated, the sum of the capacitance value of the second parasitic junction capacitor 122 and the capacitance value of the second compensation capacitor 128 is substantially equal to the capacitance value of the first parasitic junction capacitor 120, and the sum of the capacitance value of the third parasitic junction capacitor 124 and the capacitance value of the third compensation capacitor 130 is also substantially equal to the capacitance value of the first parasitic junction capacitor 120. That is, when the capacitance value of the first parasitic junction capacitor 120 is greater than the capacitance value of the second parasitic junction capacitor 122, and the capacitance value of the second parasitic junction capacitor 122 is greater than the capacitance value of the third parasitic junction capacitor 124, the capacitance value of the second compensation capacitor 128 compensates the capacitance value of the second parasitic junction capacitor 122 and the third compensation capacitor 130 compensates the capacitance value of the third parasitic junction capacitor 124 to make the sum of the capacitance value of the second parasitic junction capacitor 122 and the capacitance value of the second compensation capacitor 128 and the sum of the capacitance value of the third parasitic junction capacitor 124 and the capacitance value of the third compensation capacitor 130 be substantially equal to the capacitance value of the first parasitic junction capacitor 120.

However, in another embodiment of the present invention, if one (an $N^{th}$ parasitic junction capacitor) of the first parasitic junction capacitor 120, the second parasitic junction capacitor 122, and the third parasitic junction capacitor 124 has a minimum capacitance value, and another one (an $M^{th}$ parasitic junction capacitor) of the first parasitic junction capacitor 120, the second parasitic junction capacitor 122, and the third parasitic junction capacitor 124 has a capacitance value (e.g. a maximum capacitance value) different from the capacitance value of the $N^{th}$ parasitic junction capacitor, a capacitance value of an $N^{th}$ compensation capacitor corresponding to the $N^{th}$ parasitic junction capacitor is substantially equal to a difference between the capacitance value of the $M^{th}$ parasitic junction capacitor and the capacitance value of the $N^{th}$ parasitic junction capacitor. That is to say, when N is 1, the capacitance value of the first compensation capacitor 126 is substantially equal to a difference between the capacitance value of the $M^{th}$ parasitic junction capacitor and the capacitance value of the first parasitic junction capacitor 120; when N is 2, the capacitance value of the second compensation capacitor 128 is substantially equal to a difference between the capacitance value of the $M^{th}$ parasitic junction capacitor and the capacitance value of the second parasitic junction capacitor 122; when N is 3, the capacitance value of the third compensation capacitor 130 is substantially equal to a difference between the capacitance value of the $M^{th}$ parasitic junction capacitor and the capacitance value of the third parasitic junction capacitor 124. For example, if the third parasitic junction capacitor 124 has a maximum capacitance value X, and the first parasitic junction capacitor 120 has a minimum capacitance value Y, the capacitance value of the first compensation capacitor 126 corresponding to the first parasitic junction capacitor 120 is substantially equal to a difference (X-Y) between the capacitance value X of the third parasitic junction capacitor 124 and the capacitance value Y of the first parasitic junction capacitor 120. In addition, the $N^{th}$ compensation capacitor is not limited to being a physically single capacitor, that is, the $N^{th}$ compensation capacitor can also be an $N^{th}$ compensation capacitor device composed of one electronic device or a plurality of electronic devices connected to each other, wherein as long as a capacitance value of the $N^{th}$ compensation capacitor is substantially equal to an equivalent capacitance value of the $N^{th}$ compensation capacitor device.

Figure 9:
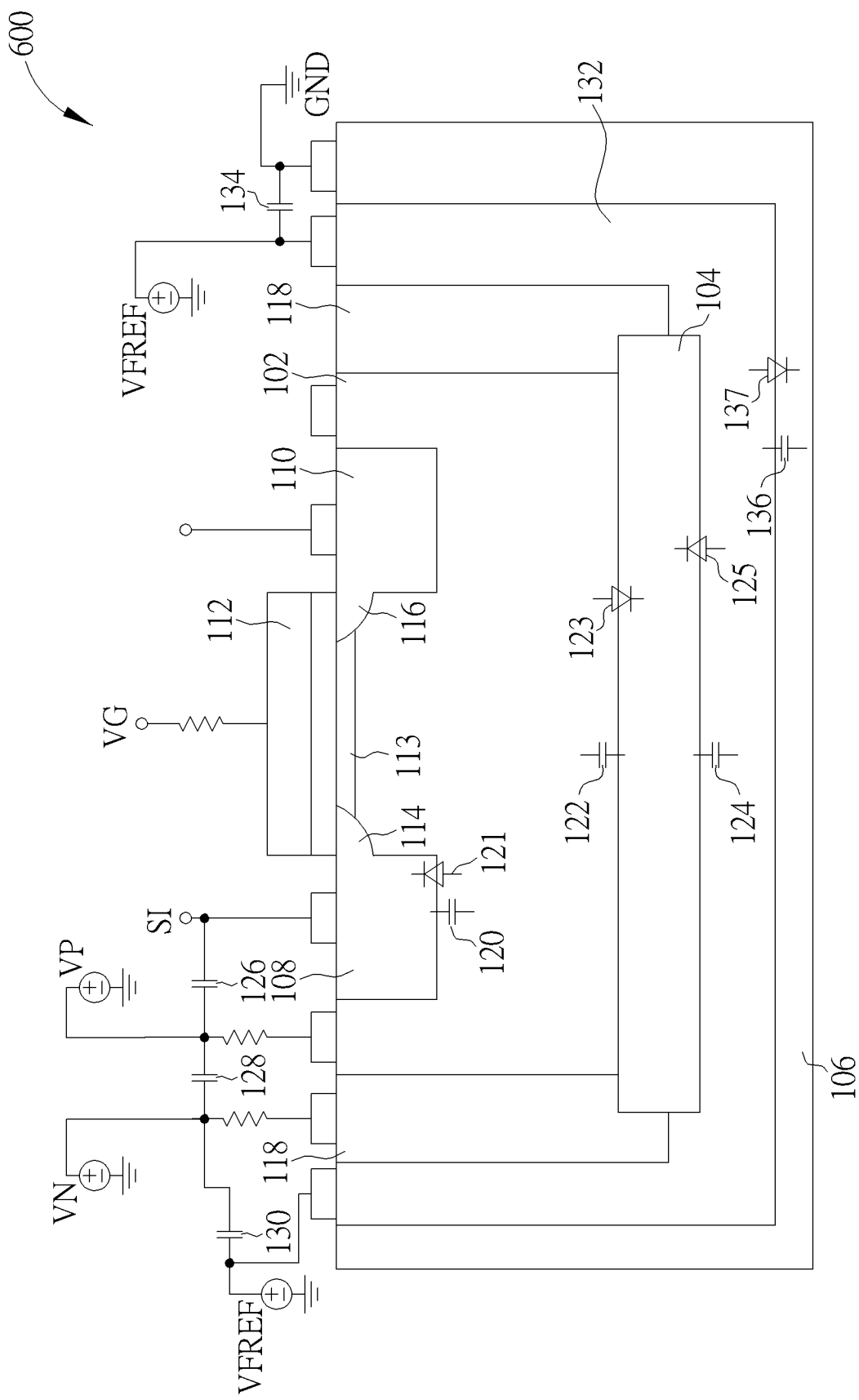
FIG. 9 is a diagram illustrating a transistor 600 for increasing a range of a swing of a signal according to a third embodiment of the present invention.
Figure 10:
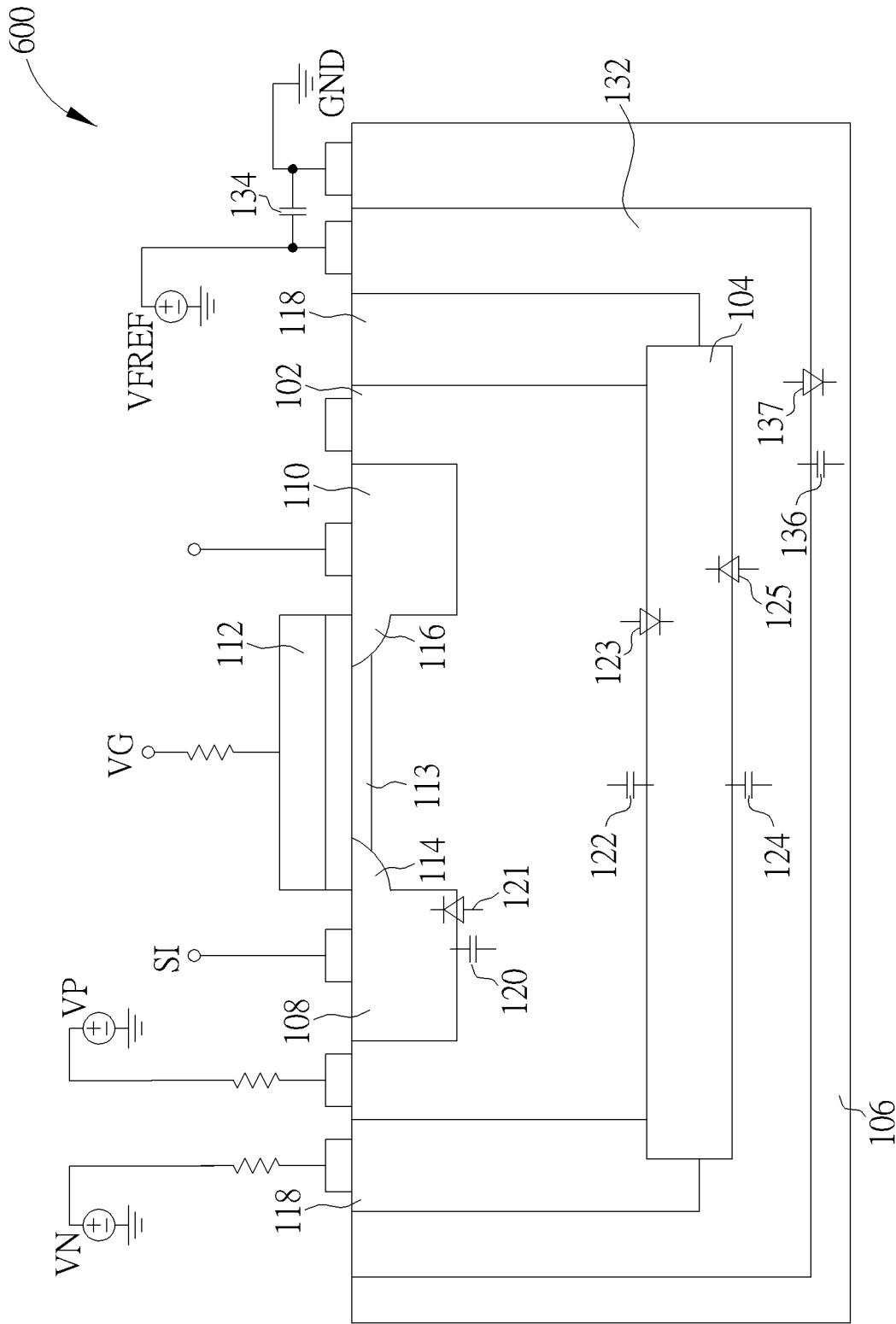
FIG. 10 is a diagram illustrating the transistor including the fourth compensation capacitor.

Please refer to FIG. 9. FIG. 9 is a diagram illustrating a transistor 600 for increasing a range of a swing of a signal according to a third embodiment of the present invention. As shown in FIG. 9, differences between the transistor 600 and the transistor 400 are that the structure layer 106 of the transistor 600 further includes a third doping well 132, and the transistor 600 further has a fourth compensation capacitor 134. As shown in FIG. 9, a fourth parasitic junction capacitor 136 and a fourth parasitic diode 137 exist between the third doping well 132 and the structure layer 106, and the third doping well 132 is formed in the substrate and between the second doping well 104 and the substrate. For example, the second doping well 104 is formed in the third doping well 132, wherein the third doping well 132 has the second conductivity type, a second reference potential VFREF is electrically connected to the third doping well 132, the first reference potential (e.g. the ground GND) is electrically connected to the structure layer 106, the fourth compensation capacitor 134 is electrically connected between the third doping well 132 and the first reference potential, and the fourth compensation capacitor 134 is used for compensating the fourth parasitic junction capacitor 136. Because the transistor 600 has the fourth compensation capacitor 134, the capacitance value of the first compensation capacitor 126, the capacitance value of the second compensation capacitor 128, the capacitance value of the third compensation capacitor 130, and a capacitance value of the fourth compensation capacitor 134 are determined at least by the capacitance value of the first parasitic junction capacitor 120, the capacitance value of the second parasitic junction capacitor 122, the capacitance value of the third parasitic junction capacitor 124, and a capacitance value of the fourth parasitic junction capacitor 136. However, in another embodiment of the present invention, the capacitance value of the first compensation capacitor 126, the capacitance value of the second compensation capacitor 128, the capacitance value of the third compensation capacitor 130, and the capacitance value of the fourth compensation capacitor 134 are further additionally determined according to the swing of the signal SI. That is, when the first doping area 108 transmits the signal SI, the first compensation capacitor 126, the second compensation capacitor 128, the third compensation capacitor 130, and the fourth compensation capacitor 134 of the transistor 600 can be utilized to compensate the first parasitic junction capacitor 120, the second parasitic junction capacitor 122, the third parasitic junction capacitor 124, and the fourth parasitic junction capacitor 136 respectively. In addition, when the first doping area 108 transmits the signal SI, the first compensation capacitor 126, the second compensation capacitor 128, the third compensation capacitor 130, and the fourth compensation capacitor 134 can also simultaneously adjust the voltage drop of the first parasitic junction capacitor 120, the voltage drop of the second parasitic junction capacitor 122, the voltage drop of the third parasitic junction capacitor 124, and a voltage drop of the fourth parasitic junction capacitor 136 distributed according to the signal SI. In addition, when the first doping area 108 transmits the signal SI, the first compensation capacitor 126, the second compensation capacitor 128, the third compensation capacitor 130, and the fourth compensation capacitor 134 can also reduce the differences between the voltage drop of the first parasitic junction capacitor 120, the voltage drop of the second parasitic junction capacitor 122, the voltage drop of the third parasitic junction capacitor 124, and the voltage drop of the fourth parasitic junction capacitor 136 to prevent the first parasitic diode 121, the second parasitic diode 123, the third parasitic diode 125, and the fourth parasitic diode 137 from being turned on. In addition, the present invention is not limited to the transistor 600 simultaneously needing to have the first compensation capacitor 126, the second compensation capacitor 128, the third compensation capacitor 130, and the fourth compensation capacitor 134. That is, a number of compensation capacitors of the transistor 600 can be adjusted according to the voltage drop of the first parasitic junction capacitor 120, the voltage drop of the second parasitic junction capacitor 122, the voltage drop of the third parasitic junction capacitor 124, and the voltage drop of the fourth parasitic junction capacitor 136. Therefore, in another embodiment of the present invention, the transistor 600 can only include at least one compensation capacitor or any two compensation capacitors of the first compensation capacitor 126, the second compensation capacitor 128, the third compensation capacitor 130, and the fourth compensation capacitor 134 to compensate at least one corresponding parasitic junction capacitor or any two corresponding parasitic junction capacitors; the transistor 600 can only include the above mentioned at least one compensation capacitor or any two compensation capacitors to simultaneously adjust the voltage drop of the first parasitic junction capacitor 120, the voltage drop of the second parasitic junction capacitor 122, the voltage drop of the third parasitic junction capacitor 124, and the voltage drop of the fourth parasitic junction capacitor 136; and the transistor 600 can only include the above mentioned at least one compensation capacitor or any two compensation capacitors to reduce the differences between the voltage drop of the first parasitic junction capacitor 120, the voltage drop of the second parasitic junction capacitor 122, the voltage drop of the third parasitic junction capacitor 124, and the voltage drop of the fourth parasitic junction capacitor 136. Another embodiment of the transistor 600 is shown in FIG. 10, wherein the transistor 600 only includes the fourth compensation capacitor 134.

In addition, other embodiments of the present invention can also further include a fourth doping well and a fifth compensation capacitor, a fifth doping well and a sixth compensation capacitor, a sixth doping well and a seventh compensation capacitor, and so on. Relationships between the above mentioned doping wells and compensation capacitors described by a parameter I are shown as follows:

The transistor 600 can further include an $I^{th}$ doping well, the $I^{th}$ doping well formed between an $(I-1)^{th}$ doping well and the substrate, wherein the $I^{th}$ doping well has a conductivity type different from a conductivity type of the $(I-1)^{th}$ doping well, an $(I-1)^{th}$ reference potential is electrically connected to the $I^{th}$ doping well, an $(I+1)^{th}$ parasitic junction capacitor exists between the $I^{th}$ doping well and the structure layer 106, and a capacitance value of the at least one compensation capacitor is determined at least by the capacitance value of the first parasitic junction capacitor 120, the capacitance value of the second parasitic junction capacitor 122, the capacitance value of the third parasitic junction capacitor 124, the capacitance value of the fourth parasitic junction capacitor 136, and a capacitance value of the $(I+1)^{th}$ parasitic junction capacitor. The at least one compensation capacitor includes an $(I+1)^{th}$ compensation capacitor electrically connected between the $I^{th}$ doping well and the $(I-1)^{th}$ reference potential, wherein the $(I+1)^{th}$ compensation capacitor is used for compensating the $(I+1)^{th}$ parasitic junction capacitor, and I is an integer greater than or equal to 4, or can be also an integer group (wherein integers included in the integer group are consecutive, and greater than or equal to 4). For example, when I is 4, the transistor 600 can further include a fourth doping well and a fifth compensation capacitor; when I is an integer group including 4, 5, the transistor 600 can further include the fourth doping well and the fifth compensation capacitor, a fifth doping well and a sixth compensation capacitor, and so on.

Similarly, if one (an $N^{th}$ parasitic junction capacitor) of the first parasitic junction capacitor 120, the second parasitic junction capacitor 122, the third parasitic junction capacitor 124, the fourth parasitic junction capacitor 136 has a minimum capacitance value, and another one (an $M^{th}$ parasitic junction capacitor) of the first parasitic junction capacitor 120, the second parasitic junction capacitor 122, the third parasitic junction capacitor 124, the fourth parasitic junction capacitor 136 has a capacitance value (e.g. a maximum capacitance value) different from the capacitance value of the $N^{th}$ parasitic junction capacitor, a capacitance value of an $N^{th}$ compensation capacitor corresponding to the $N^{th}$ parasitic junction capacitor is substantially equal to a difference between the capacitance value of the $M^{th}$ parasitic junction capacitor and the capacitance value of the $N^{th}$ parasitic junction capacitor. In addition, the $N^{th}$ compensation capacitor is not limited to a physically single capacitor, can also be an $N^{th}$ compensation capacitor device formed by one electrical device or a plurality electrical devices connected to each other, wherein an equivalent capacitance value of the $N^{th}$ compensation capacitor is substantially equal to an equivalent capacitance value of the $N^{th}$ compensation capacitor device.

To sum up, when the transistor transmits the signal, the embodiment of the present invention applies different predetermined voltages to different doping wells respectively to increase a reverse bias across each parasitic junction diode, or utilizes the at least one compensation capacitor to compensate at least one parasitic junction capacitor to make voltage drop differences between at least one parasitic junction capacitor be reduced, so compared to the prior art, the embodiments of the present invention can increase the range of the swing of the signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transistor for increasing a range of a swing of a signal, comprising:
   a first doping well formed in a structure layer;
   a second doping well formed in the structure layer, and the second doping well formed between the first doping well and the structure layer;
   a first doping area formed in the first doping well for transmitting the signal;
   a second doping area formed in the first doping well, wherein the first doping area, the second doping area, and the second doping well have a first conductivity type, and the first doping well has a second conductivity type;
   a gate area for making a channel be formed between the first doping area and the second doping area; and
   at least one compensation capacitor formed outside the first doping area, the second doping area, the first doping well, the second doping well and the structure layer, and electrically connected between the first doping well and the second doping well or between the second doping well and a first reference potential;
   wherein a first parasitic junction capacitor exists between the first doping area and the first doping well, a second parasitic junction capacitor exists between the first doping well and the second doping well, a third parasitic junction capacitor exists between the second doping well and the structure layer; and the at least one compensation capacitor is used for adjusting a voltage drop of the second parasitic junction capacitor or a voltage drop of the third parasitic junction capacitor.

2. The transistor of claim 1, wherein the at least one compensation capacitor is used for reducing differences between the voltage drop of the second parasitic junction capacitor and the voltage drop of the third parasitic junction capacitor.

3. The transistor of claim 1, wherein a capacitance value of the at least one compensation capacitor is determined at least by a capacitance value of the first parasitic junction capacitor, a capacitance value of the second parasitic junction capacitor, and a capacitance value of the third parasitic junction capacitor.

4. The transistor of claim 1, wherein a capacitance value of the first parasitic junction capacitor is greater than a capacitance value of the second parasitic junction capacitor, the capacitance value of the second parasitic junction capacitor is greater than a capacitance value of the third parasitic junction capacitor, and a sum of a voltage drop of the first parasitic junction capacitor, the voltage drop of the second parasitic junction capacitor, and the voltage drop of the third parasitic junction capacitor is substantially equal to the swing of the signal.

5. The transistor of claim 1, wherein the first doping well receives a first voltage, the second doping well receives a second voltage, and a voltage polarity of the first voltage is opposite to a voltage polarity of the second voltage.

6. The transistor of claim 1, wherein the at least one compensation capacitor is a metal-insulator-metal (MIM) capacitor.

7. The transistor of claim 1, wherein the at least one compensation capacitor comprises a first compensation capacitor electrically connected between the first doping area and the first doping well, wherein the first compensation capacitor is used for compensating the first parasitic junction capacitor.

8. The transistor of claim 1, wherein the at least one compensation capacitor comprises a second compensation capacitor electrically connected between the first doping well and the second doping well, wherein the second compensation capacitor is used for compensating the second parasitic junction capacitor.

9. The transistor of claim 1, wherein the at least one compensation capacitor comprises a third compensation capacitor electrically connected between the second doping well and the first reference potential, wherein the third compensation capacitor is used for compensating the third parasitic junction capacitor.

10. The transistor of claim 1, further comprising:
    a third doping well formed in a substrate, and the third doping well formed between the second doping well and the substrate, wherein the third doping well has the second conductivity type, a second reference potential is electrically connected to the third doping well, the first reference potential is electrically connected to the structure layer, a fourth parasitic junction capacitor exists between the third doping well and the structure layer, a capacitance value of the at least one compensation capacitor is determined at least by a capacitance value of the first parasitic junction capacitor, a capacitance value of the second parasitic junction capacitor, a capacitance value of the third parasitic junction capacitor, and a capacitance value of the fourth parasitic junction capacitor, and the at least one compensation capacitor comprises a fourth compensation capacitor electrically connected between the third doping well and the second reference potential, wherein the fourth compensation capacitor is used for compensating the fourth parasitic junction capacitor.

11. The transistor of claim 10, further comprising:
a fourth doping well formed between the third doping well and the substrate, wherein the fourth doping well has a conductivity type different from a conductivity type of the third doping well, a third reference potential is electrically connected to the fourth doping well, a fifth parasitic junction capacitor exists between the fourth doping well and the structure layer, and the at least one compensation capacitor comprises a fifth compensation capacitor electrically connected between the fourth doping well and the third reference potential, wherein the fifth compensation capacitor is used for compensating the fifth parasitic junction capacitor.

12. The transistor of claim 10, further comprising:
a plurality of doping wells formed between the third doping well and the substrate, wherein a $I^{th}$ doping well of the plurality of doping wells has a conductivity type different from a conductivity type of an $(I-1)^{th}$ doping well of the plurality of doping wells, an $(I-1)^{th}$ reference potential is electrically connected to the $J^{th}$ doping well, a $J^{th}$ parasitic junction capacitor exists between the $(I-1)^{th}$ doping well and the $I^{th}$ doping well, an $(I+1)^{th}$ parasitic junction capacitor exists between the $I^{th}$ doping well and an $(I+1)^{th}$ doping well of the plurality of doping wells, a corresponding parasitic junction capacitor exists between a last doping well of the plurality of doping wells and the structure layer, and the at least one compensation capacitor comprises an $(I+1)^{th}$ compensation capacitor electrically connected between the $I^{th}$ doping well and the $(I-1)^{th}$ reference potential, wherein the $(I+1)^{th}$ compensation capacitor is used for compensating the $(I+1)^{th}$ parasitic junction capacitor, and I is an integer greater than or equal to 4.

13. The transistor of claim 1, wherein an $N^{th}$ parasitic junction capacitor of the first parasitic junction capacitor, the second parasitic junction capacitor, and the third parasitic junction capacitor has a minimum capacitance value, and an $M^{th}$ parasitic junction capacitor has a capacitance value different from the minimum capacitance value of the $N^{th}$ parasitic junction capacitor, wherein
when N is 2, the at least one compensation capacitor comprises a second compensation capacitor electrically connected between the first doping well and the second doping well, and a capacitance value of the second compensation capacitor is substantially equal to a difference between the capacitance value of the $M^{th}$ parasitic junction capacitor and a capacitance value of the second parasitic junction capacitor; or
when N is 3, the at least one compensation capacitor comprises a third compensation capacitor electrically connected between the second doping well and the first reference potential, and a capacitance value of the third compensation capacitor is substantially equal to a difference between the capacitance value of the $M^{th}$ parasitic junction capacitor and a capacitance value of the third parasitic junction capacitor.

14. The transistor of claim 13, wherein the $M^{th}$ parasitic junction capacitor has a maximum capacitance value of the capacitance value of the first parasitic junction capacitor, the capacitance value of the second parasitic junction capacitor, and the capacitance value of the third parasitic junction capacitor.

15. The transistor of claim 1, further comprising:
a third doping well formed in a substrate, and the third doping well formed between the second doping well and the substrate, wherein the third doping well has the second conductivity type, a second reference potential is electrically connected to the third doping well, the first reference potential is electrically connected to the structure layer, and a fourth parasitic junction capacitor exists between the third doping well and the structure layer, wherein an $N^{th}$ parasitic junction capacitor of the first parasitic junction capacitor, the second parasitic junction capacitor, the third parasitic junction capacitor, and the fourth parasitic junction capacitor has a minimum capacitance value, and an $M^{th}$ parasitic junction capacitor has a capacitance value different from the minimum capacitance value of the $N^{th}$ parasitic junction capacitor, wherein
when N is 1, the at least one compensation capacitor comprises a first compensation capacitor electrically connected between the first doping area and the first doping well, and a capacitance value of the first compensation capacitor is substantially equal to a difference between a capacitance value of the $M^{th}$ parasitic junction capacitor and a capacitance value of the first parasitic junction capacitor;
when N is 2, the at least one compensation capacitor comprises a second compensation capacitor electrically connected between the first doping well and the second doping well, and a capacitance value of the second compensation capacitor is substantially equal to a difference between the capacitance value of the $M^{th}$ parasitic junction capacitor and a capacitance value of the second parasitic junction capacitor;
when N is 3, the at least one compensation capacitor comprises a third compensation capacitor electrically connected between the second doping well and the first reference potential, and a capacitance value of the third compensation capacitor is substantially equal to a difference between the capacitance value of the $M^{th}$ parasitic junction capacitor and a capacitance value of the third parasitic junction capacitor; or
when N is 4, the at least one compensation capacitor comprises a fourth compensation capacitor electrically connected between the third doping well and the second reference potential, and a capacitance value of the fourth compensation capacitor is substantially equal to a difference between the capacitance value of the $M^{th}$ parasitic junction capacitor and a capacitance value of the fourth parasitic junction capacitor.

16. The transistor of claim 15, wherein the $M^{th}$ parasitic junction capacitor has a maximum capacitance value of the capacitance value of the first parasitic junction capacitor, the capacitance value of the second parasitic junction capacitor, the capacitance value of the third parasitic junction capacitor, and the capacitance value of the fourth parasitic junction capacitor.

17. A transistor comprising:
a first doping well formed in a structure layer;
a second doping well formed in the structure layer, and the second doping well formed between the first doping well and the structure layer;
a first doping area formed in the first doping well;
a second doping area formed in the first doping well, wherein the first doping area, the second doping area, and the second doping well have a first conductivity type, and the first doping well has a second conductivity type;
a gate area for making a channel be formed between the first doping area and the second doping area; and
at least one compensation capacitor formed outside the first doping area, the second doping area, the first doping well, the second doping well and the structure layer, and electrically connected between the first doping well and the second doping well or between the second doping well and a first reference potential;

wherein a first parasitic junction capacitor exists between the first doping area and the first doping well, a second parasitic junction capacitor exists between the first doping well and the second doping well, and a third parasitic junction capacitor exists between the second doping well and the structure layer;

wherein an $N^{th}$ parasitic junction capacitor of the first parasitic junction capacitor, the second parasitic junction capacitor, and the third parasitic junction capacitor has a minimum capacitance value, and an $M^{th}$ parasitic junction capacitor has a capacitance value different from the minimum capacitance value of the $N^{th}$ parasitic junction capacitor, and wherein when N is 2, the at least one compensation capacitor comprises a second compensation capacitor electrically connected between the first doping well and the second doping well for adjusting a voltage drop of the second parasitic junction capacitor; or when N is 3, the at least one compensation capacitor comprises a third compensation capacitor electrically connected between the second doping well and the first reference potential for adjusting a voltage drop of the third parasitic junction capacitor.

18. The transistor of claim 17, wherein
when N is 2, a capacitance value of the second compensation capacitor is substantially equal to a difference between the capacitance value of the $M^{th}$ parasitic junction capacitor and a capacitance value of the second parasitic junction capacitor; or when N is 3, a capacitance value of the third compensation capacitor is substantially equal to a difference between the capacitance value of the $M^{th}$ parasitic junction capacitor and a capacitance value of the third parasitic junction capacitor.

19. The transistor of claim 17, wherein the $M^{th}$ parasitic junction capacitor has a maximum capacitance value of the capacitance value of the first parasitic junction capacitor, the capacitance value of the second parasitic junction capacitor, and the capacitance value of the third parasitic junction capacitor.

20. A transistor comprising:
a first doping well formed in a structure layer;
a second doping well formed in the structure layer, and the second doping well formed between the first doping well and the structure layer;
a first doping area formed in the first doping well;
a second doping area formed in the first doping well, wherein the first doping area, the second doping area, and the second doping well have a first conductivity type, and the first doping well has a second conductivity type;
a gate area for making a channel be formed between the first doping area and the second doping area;
a first parasitic junction capacitor exists between the first doping area and the first doping well;
a second parasitic junction capacitor exists between the first doping well and the second doping well;
a third parasitic junction capacitor exists between the second doping well and the structure layer; and
at least one compensation capacitor formed outside the first doping area, the second doping area, the first doping well, the second doping well and the structure layer, and electrically connected between the first doping well and the second doping well or between the second doping well and a first reference potential, wherein the at least one compensation capacitor is used for adjusting a voltage drop of the second parasitic junction capacitor or a voltage drop of the third parasitic junction capacitor.

21. The transistor of claim 20,
wherein an $N^{th}$ parasitic junction capacitor of the first parasitic junction capacitor, the second parasitic junction capacitor, and the third parasitic junction capacitor has a minimum capacitance value, and an $M^{th}$ parasitic junction capacitor has a capacitance value different from the minimum capacitance value of the $N^{th}$ parasitic junction capacitor, and wherein when N is 2, the at least one compensation capacitor comprises a second compensation capacitor electrically connected between the first doping well and the second doping well; or when N is 3, the at least one compensation capacitor comprises a third compensation capacitor electrically connected between the second doping well and the first reference potential.

22. The transistor of claim 21, wherein
when N is 2, a capacitance value of the second compensation capacitor is substantially equal to a difference between the capacitance value of the $M^{th}$ parasitic junction capacitor and a capacitance value of the second parasitic junction capacitor; or when N is 3, a capacitance value of the third compensation capacitor is substantially equal to a difference between the capacitance value of the $M^{th}$ parasitic junction capacitor and a capacitance value of the third parasitic junction capacitor.

* * * * *